(12) United States Patent
Francis

(10) Patent No.: US 6,884,303 B2
(45) Date of Patent: Apr. 26, 2005

(54) PROCESS OF THINNING AND BLUNTING SEMICONDUCTOR WAFER EDGE AND RESULTING WAFER

(75) Inventor: Richard Francis, Manhattan Beach, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/225,551

(22) Filed: Aug. 19, 2002

(65) Prior Publication Data

US 2002/0192964 A1 Dec. 19, 2002

Related U.S. Application Data

(62) Division of application No. 09/676,324, filed on Sep. 29, 2000, now Pat. No. 6,465,353.

(51) Int. Cl.[7] .............................................. H01L 29/00
(52) U.S. Cl. ....................................................... 148/33
(58) Field of Search .............................. 438/459, 692, 438/734, 750, 977, FOR 485, FOR 458, FOR 111, FOR 409; 148/33

(56) References Cited

U.S. PATENT DOCUMENTS

| 4,054,010 | A | * | 10/1977 | Shipman | 451/159 |
| 4,390,392 | A | * | 6/1983 | Robinson et al. | 438/473 |
| 4,947,598 | A | * | 8/1990 | Sekiya | 451/41 |
| 5,945,351 | A | * | 8/1999 | Mathuni | 438/706 |
| 6,245,678 | B1 | * | 6/2001 | Yamamoto et al. | 438/692 |
| 6,312,487 | B1 | * | 11/2001 | Tanaka | 51/309 |
| 6,417,075 | B1 | * | 7/2002 | Haberger et al. | 438/459 |
| 6,494,221 | B1 | * | 12/2002 | Sellmer et al. | 134/147 |
| 6,514,423 | B1 | * | 2/2003 | Ng et al. | 216/38 |
| 2001/0015168 | A1 | * | 8/2001 | Dietze et al. | 117/13 |

FOREIGN PATENT DOCUMENTS

| EP | 297648 A2 | * | 1/1989 | H01L/21/00 |
| EP | 368334 A2 | * | 5/1990 | H01L/21/00 |

* cited by examiner

Primary Examiner—George Fourson
(74) Attorney, Agent, or Firm—Ostrolenk, Faber, Gerb & Soffen, LLP

(57) ABSTRACT

A wafer having a rounded edge is thinned to 100 microns or less, producing a tapered razor like edge. The edge is ground to blunt it and reduce danger to personnel and equipment during handling of the wafer.

16 Claims, 1 Drawing Sheet

PROCESS OF THINNING AND BLUNTING SEMICONDUCTOR WAFER EDGE AND RESULTING WAFER

RELATED APPLICATION

This is a divisional of U.S. patent application Ser. No. 09/676,324, filed Sep. 29, 2000 in the name of Richard Francis and entitled PROCESS OF THINNING AND BLUNTING SEMICONDUCTOR WAFER EDGE AND RESULTING WAFER which issued on Oct. 15, 2002 as U.S. Pat. No. 6,465,353.

FIELD OF THE INVENTION

This invention relates to a semiconductor wafer structure and process for its manufacture and more specifically relates to an ultra thin wafer and process for blunting the outer peripheral edge of a wafer.

BACKGROUND OF THE INVENTION

Semiconductor wafers such as thin monocrystaline silicon wafers are commonly used in semiconductor device fabrication. These wafers can have any desired diameter, for example, 1" to 10" and have varying thicknesses, typically about 300 to 600 microns. The entire wafer is photolithographically processed, receiving on its top surface a large number of spaced sets of diffusions, oxidations, etches, washes, metal layers and the like to form a large number of identical devices such as transistors, diodes, and other such devices. After processing, the wafers are frequently thinned by grinding from the wafer back surface to a thickness desired to satisfy a desired characteristic of the device. The individual devices are then separated by cutting through the wafer.

It is well known to generally round the edge of the wafer before processing to prevent chipping and cracking of the thin, brittle monocrystaline wafer during processing. However, when wafers with this prior rounding process are reduced in thickness to less than about 100 microns, the resulting tapered edge is razor sharp and becomes dangerous to handle in the wafer fabrication facility. Further, the razor sharp edge will easily cut into or catch into surfaces within the fabrication facility and crack or impede the desired movement of the wafer between different process step positions.

Many recent semiconductor devices have a need for ultrathin semiconductor die. For example, Insulated Gate Bipolar Transistors of the "punch-through" type and with a "transparent" collector region and rated at 600 volts or more can be made in wafers about 100 microns thick. Other voltage ratings require even thinner wafers, some as thin as 70 microns. Such devices are described in co-pending application Ser. No. 09/565,973, filed May 5, 2000 (IR 17071). These wafers are initially about 400 microns thick and are sufficiently strong to resist breakage during the processing of the top surface of the wafer. The wafers, with conventionally rounded edges are then ground from one side, for example, to a thickness of less than about 100 microns, and the ground surface is then exposed to a stress relief treatment. Top metal is then added and the wafers are diced. If the back grind is greater than one half of the initial wafer thickness, the back surface will meet the rounded edge with an acute angle, forming a razor-like edge. The extremely sharp tapered edge of the 100 micron thick wafer (or even less) can easily cut personnel and can cut into the processing equipment as the wafers are moved to different positions and are loaded or unloaded from wafer boats.

BRIEF DESCRIPTION OF THE INVENTION

In accordance with the invention, the outer edge of a wafer after thinning is squared or otherwise blunted to remove its tapered razor edge. This blunting operation may be performed as by grinding after a front metal is applied, but may be performed at any step of the process after the wafer is thinned. The resulting wafer then has a blunted cutting edge and is less dangerous to handle and is less likely to be hung up in the processing equipment. Further, the material removed by grinding is tapered and is unsuitable to contain useful die, so that useful silicon area is not sacrificed.

DETAILED DESCRIPTION OF THE DRAWINGS

Figure 1:
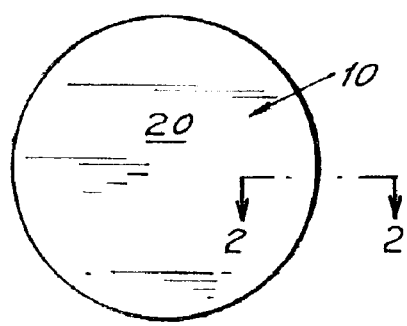
FIG. 1 is a top plan view of a conventional semiconductor wafer.

Referring to FIG. 1, there is shown a typical semiconductor wafer 10 which may be a monocrystaline silicon wafer which is sliced from a drawn ingot and may have a starting thickness of, for example, 300 microns to 600 microns.

Figure 2:
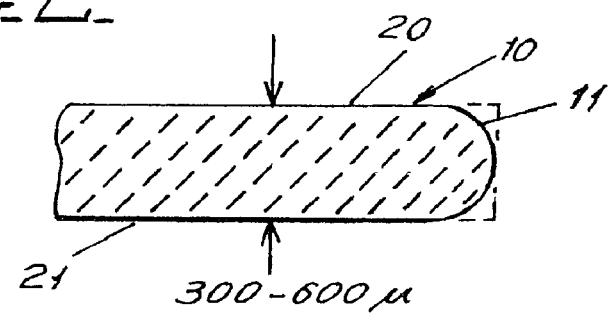
FIG. 2 is a cross-section of FIG. 1 taken across section line 2—2 in FIG. 1 and shows the shape of the wafer edge before and after rounding.

The edge of wafer 10 is commonly rounded as shown at 11 in FIG. 2 from its original square cross-section shown in dotted lines, as by grinding. This reduces the tendency of the wafer 10 to chip at its edge.

Figure 3:
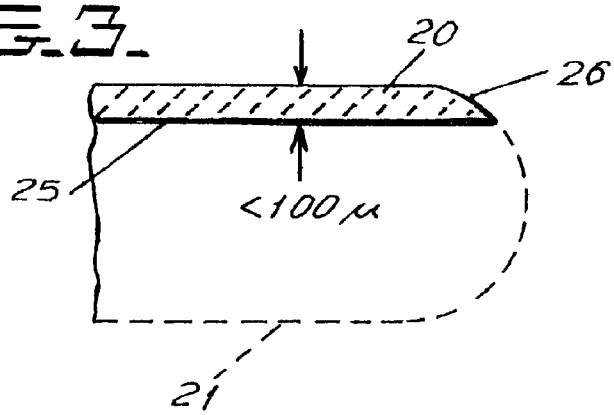
FIG. 3 shows the wafer of FIG. 2 after thinning.

Wafer 10 has a top surface 20 and a bottom surface 21 (FIGS. 2 and 3). During processing, junctions, oxides and polysilicon and the like are formed on and into the top surface 20 of the wafer, forming the individual semiconductor die which are to be separated after the wafer processing is completed.

Figure 4:
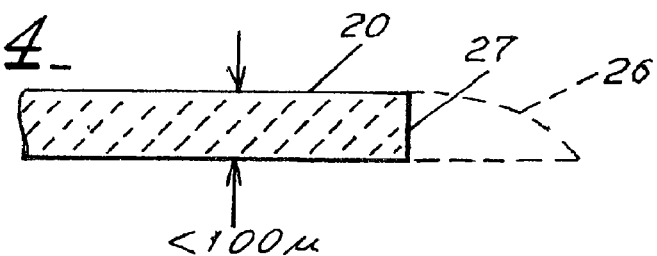
FIG. 4 shows the wafer of FIG. 3 after its razor edge is ground square to remove the razor edge of FIG. 3.

After completing the top surface fabrication, the wafer is next thinned as by grinding the bottom surface 21 to thin the wafer, for example, to 100 microns or less, and to new bottom surface 25 (FIGS. 3 and 4). A stress relief etch may then be applied to surface 25.

The thinning operation, with the prior rounding grind, produces a tapered razor like edge 26 (FIG. 3 and 4) if the wafer is ground to more than one-half of its original thickness. In accordance with the invention, the tapered edge is ground off to blunt edge 27 of FIG. 4. The grind extends around the full periphery of the wafer, although it may be applied only to a selected portion, or portions thereof. The blunted edge 27 is preferably square and perpendicular to the plane of wafer 10, but it may be at an angle greater than about 45° C., and may also be rounded if desired.

The processing of the wafer may then continue as desired with reduced risk to personal and to the wafer itself due to sharp edge 26.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A semiconductor device wafer comprising:

a semiconductor wafer sliced from a drawn ingot, said sliced wafer having a first major surface, a second major surface opposing said first major surface, and a thickness less than 100 microns;

individual semiconductor die residing at said first major surface of said wafer;

blunt peripheral edge extending between said first major surface and said second major surface, wherein said edge is perpendicular to said first and second major surfaces.

2. A semiconductor device wafer according to claim 1, wherein said peripheral edge is rounded.

3. A semiconductor device wafer according to claim 1, wherein an angle between at least one of said major surfaces and said peripheral edge is more than 45 degrees.

4. A semiconductor device wafer according to claim 1, wherein said semiconductor wafer is comprised of monocrystalline silicon.

5. A semiconductor device wafer according to claim 1, wherein said semiconductor wafer is ground from an initial thickness to said thickness of 100 microns after formation of said individual semiconductor die.

6. A semiconductor device wafer according to claim 5, wherein a relief etch is applied after said wafer is ground to relieve said ground surface.

7. A semiconductor device wafer according to claim 5, wherein said initial thickness is between 300 microns to 600 microns.

8. A semiconductor device wafer according to claim 1, wherein said peripheral edge is mechanically shaped by grinding.

9. A semiconductor device wafer comprising:

a semiconductor wafer sliced from a drawn ingot, said sliced wafer having a first major surface, a second major surface opposing said first major surface, and a thickness less than 100 microns;

individual semiconductor die residing at said first major surface of said wafer;

mechanically shaped peripheral edge extending between said first major surface and said second major surface, wherein said peripheral edge is blunted by said mechanical shaping of said peripheral surface and wherein said edge is perpendicular to said first and second major surfaces.

10. A semiconductor device wafer according to claim 9, wherein said mechanically shaped peripheral edge is rounded.

11. A semiconductor device wafer according to claim 9, wherein an angle between at least one of said major surfaces and said peripheral edge is more than 45 degrees.

12. A semiconductor device wafer according to claim 9, wherein said semiconductor wafer is comprised of monocrystalline silicon.

13. A semiconductor device wafer according to claim 9, wherein said semiconductor wafer is ground from an initial thickness to said thickness of 100 microns after formation of said individual semiconductor die.

14. A semiconductor device wafer according to claim 13, wherein a relief etch is applied after said wafer is ground to relieve said ground surface.

15. A semiconductor device wafer according to claim 13, wherein said initial thickness is between 300 microns to 600 microns.

16. A semiconductor device wafer according to claim 9, wherein said peripheral edge is mechanically shaped by grinding.

* * * * *